US008587990B2

(12) United States Patent
Chan et al.

(10) Patent No.: US 8,587,990 B2
(45) Date of Patent: Nov. 19, 2013

(54) GLOBAL BIT LINE RESTORE BY MOST SIGNIFICANT BIT OF AN ADDRESS LINE

(75) Inventors: Yuen H. Chan, Poughkeepsie, NY (US); Michael Kugel, Boeblingen (DE); Raphael Polig, Reutlingen (DE); Tobias T. Werner, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 13/179,684

(22) Filed: Jul. 11, 2011

(65) Prior Publication Data
US 2012/0008379 A1 Jan. 12, 2012

(30) Foreign Application Priority Data

Jul. 12, 2010 (EP) .................................. 10169206

(51) Int. Cl.
*G11C 11/00* (2006.01)
(52) U.S. Cl.
USPC .............................. 365/154; 365/63; 365/203
(58) Field of Classification Search
USPC .................................. 365/154, 63, 203, 156
See application file for complete search history.

(56) References Cited

U.S. PATENT DOCUMENTS

| 6,275,442 | B1 * | 8/2001 | Hill et al. .................. 365/230.06 |
| 6,798,688 | B2 | 9/2004 | Joshi |
| 7,170,774 | B2 | 1/2007 | Chan et al. |
| 7,542,350 | B2 | 6/2009 | Park et al. |
| 2005/0007861 | A1 | 1/2005 | Deng et al. |
| 2006/0062061 | A1 * | 3/2006 | Suh et al. ...................... 365/203 |
| 2009/0231898 | A1 | 9/2009 | Fisch et al. |
| 2010/0027317 | A1 | 2/2010 | Maejima |

OTHER PUBLICATIONS

Ayala, Jose, L. et al. "A Hardware Mechanism to Reduce the Energy Consumption of the Register File of In-Order Architectures," International Journal of Embedded Systems 2008—vol. 3, No. 4, pp. 285-293, Mar. 18, 2011.
Raveendran, Biju K. et al., "LLRU: Late LRU Replacement Strategy for Power Efficient Embedded Cache," 15th International Conference on Advanced Computing and Communications, IEEE Computer Society, pp. 339-344, Jan. 7, 2008.
Ubal, R., et al., "Leakage Current Reduction in Data Caches on Embedded Systems," 2007 International Conference on Intelligent Pervasive Computing, IEEE Computer Society, pp. 45- 50, Oct. 11, 2007.
Kim, Soontae, et al., "Reducing Non-Deterministic Loads in Low-Power Caches Via Early Cache Set Resolution," www.sciencedirect.com, pp. 293-301, Nov. 27, 2006.

* cited by examiner

*Primary Examiner* — Huan Hong
(74) *Attorney, Agent, or Firm* — John E. Campbell; Kevin P. Radigan, Esq.; Heslin Rothenberg Farley & Mesiti P.C.

(57) ABSTRACT

An SRAM circuitry having SRAM cells for storing at least one data word of a length of at least one bit is provided. Each bit of the data words is stored in an assigned SRAM cell, wherein the SRAM circuitry comprises address lines for addressing the at least one data word, a decoding unit for decoding the address signals on the address lines to generate a word line signals on a word line per addressed word, a local bit line to be coupled to SRAM cells of different data words with different addresses, a global bit line to be coupled to the local bit line, and a global bit line restore unit for pre-charging the global bit line. The global bit line restore unit is configured for being triggered by a trigger signal based on the address signal of one of the decoded address lines.

15 Claims, 5 Drawing Sheets

GLOBAL BIT LINE RESTORE BY MOST SIGNIFICANT BIT OF AN ADDRESS LINE

PRIOR FOREIGN APPLICATION

This application claims priority from European patent application number 10169206.9, filed Jul. 12, 2010, which is hereby incorporated herein by reference in its entirety.

BACKGROUND

The invention relates generally to an SRAM circuitry for storing at least one data word, and more specifically to a global bit line restore of an SRAM circuitry, as well as to a method for restoring of a global bit line in an SRAM circuitry.

Today, computing systems require even more and faster memory chips. The chips could be main memory chips, as replacement for bulk memory in the form of solid state random access memory (RAM) for on-chip memory elements that are integrated with central processing unit (CPU) elements. CPUs today comprise typically level-1 (L1 cache) and level-2 (L2) caches. Main memory in computer systems is typically realized by dynamic RAM elements. Such elements need a regular refresh of the stored content and are comparably slow in contrast to static RAMs (SRAMs). SRAMs are not required to be refreshed regularly to keep their content. They keep the information stored as long as an SRAM cell is supplied with electrical power.

Memory elements that are very close to the CPU or algorithmic logical unit (ALU), e.g. L1 or L2 cache, are sometimes used for address translation purposes. Such memory elements have to be extremely fast in order to keep pace with ever decreasing clock cycles of the CPU. These memory elements are typically made of SRAM cells. A group of SRAM cells may build a memory word comprising data bits that may be addressed individually together as a data word. The addressing may be done by decoding coded address lines that form an individual word line (WL). The word line may represent a sort of select line for a select signal for one or more of the individual memory cells, e.g., a memory word. The memory cells may be realized by typical SRAM cells with six transistors as they are well known in the art. A word may be typically eight bits long. It may as well have just one bit length or 64 bit length or any other length of bits.

When an SRAM cell is selected by a word line, the stored content in form of a bit will be available at an output line of the SRAM cell. This information may be a "0" or a "1" signal. In order to make the stored information available to other components of a computer system, the output lines of several SRAM cells belonging to different data words are coupled to a local bit line (LBL). If an SRAM cell is selected by a signal on the associated word line, the stored signal (e.g., "0" or "1") is available on the local bit line and may be detected as a voltage on the local bit lines.

One drawback of a conventional SRAM device is that the discharge of the local bit line may be delayed due to RC effects induced by distant connection routes between elements in an SRAM circuitry, e.g., by different metallization levels. As a result, the performance or speed of a conventional SRAM device may be less than ideal. Therefore, in order to guarantee a reliable read-out of cells at high speed, a special read-out procedure is followed.

This procedure includes "charging" or "pre-charging" of a local bit line with electrical charge carriers before reading or evaluating information out of an SRAM cell, i.e., before detecting voltages on the local bit line. This process may be called "restore" of the local bit line. It should not be inter- mixed with a refresh or refresh cycles required for dynamic or DRAM cells. Before detecting voltages at a local bit line, the local bit line is charged with charge carriers. The charging is stopped just before a coupling or connection is established between the SRAM cell and the local bit line. If the content in the SRAM cell is "0" the local bit line may be discharged through the SRAM cell and a logical value "0" may be detected on the local bit line. If on the other hand, the content of the SRAM cell is "1", then no discharge of the carriers of the local bit line happens and a logical "1" is detected on the local bit line.

It may be important to control the timing between a restore and voltage detection/reading of the local bit line very carefully. Firstly, the restore window may be as large as possible to charge the local bit line as much as possible. On the other hand, there may not be an overlap with the "select" of the SRAM cell by the word line and the connection between the SRAM cell and the local bit line because this may result in a short cut or unwanted power burns. As an example, document U.S. Pat. No. 7,170,774 B2 discloses a global bit line restore based on a clock signal.

A concept of bit line segments in a memory array is disclosed by U.S. Patent Publication No. 2009/0231898 A1. The embodiments of this document are discussed in the context of dynamic memory cells.

Document U.S. Patent Publication No. 2005/0007861 A1 discloses an SRAM cell design directed to low power consumption, if the SRAM is in a stand-by mode. Surrounding elements that are not required to keep the information in a memory cell are powered down.

Such a time management of different select, read, and restore signals becomes critical as the frequency of processors constantly increases. The luxury of time margins between associated signals is thereby reduced. This applies especially to cases in which a system frequency approaches 5 Ghz or more.

The local bit line design, as just described, is also known as shared distributed dynamic node. Because of RC effects and other physical requirements, today, a number of local bit lines may be coupled or connected to a global bit line. In this case, a number of SRAM cells may be coupled to corresponding local bit lines. SRAM cells may not be coupled to global bit lines directly. However, a number of local bit lines may be coupled to a global bit line. The reading from the global bit line is done in a similar manner as just described in case of the local bit lines.

Prior to a voltage detection/read, the global bit line may be charged. However, the timing for the charging or restore of the global bit line may be even more time critical and may need to be synchronized very effectively with a select signal for triggering a read of a data bit of an SRAM cell.

A known technique to control the restore of the global bit line may be based on a clock signal. However, the high frequencies with which today's CPUs are operated imply that timing inaccuracies cannot be avoided in order to generate an optimal global bit line restore signal. For example, timing control variations of word clock signals may increase a misalignment of a local and a global restore (short expression for local bit line restore or global bit line restore).

In addition, there are dependencies to be taken into account. Local and global restores have a strong relationship that needs to be honored in order to prevent unnecessary power burn: a) global restore may only start after local restore is started; b) a next read cycle—or evaluation cycle—may only start after the global bit line restore may have been finished. Prior art suffers to guarantee an advanced timing due to a completely separate path for a global bit line restore compared to a local bit line restore. In particular, if hardware process variations are involved, timing variations for a global bit line restore may be involved, since no common path exists between local and global bit line restore signals generation. It may also be mentioned that—in prior art technique—a timing control variation of a word clock may increase a misalignment of a local and a global bit line restore.

Therefore, there is a need for an architecture or topology for effective coordination of a local and a global restore procedure.

BRIEF SUMMARY

This need may be addressed by an SRAM circuitry for storing at least one data word, and in particular by a global bit line restore of an SRAM circuitry, as well as to a method for restoring of a global bit line in an SRAM circuitry having the features according to the independent claims.

According to one embodiment, an SRAM (static random access memory) circuitry having SRAM cells for storing data words of a length of at least one bit, wherein each bit of the data words is stored in an assigned SRAM cell, may comprise: address lines for addressing the data words by address signals, a decoding unit for decoding address signals on the address lines to generate word line signals on a word-line per addressed word, a local bit line to be coupled to SRAM cells of different data words with different addresses, a global bit line to be coupled to the local bit line, and a global bit line restore unit for pre-charging the global bit line upon being triggered by a trigger signal based on the address signal of one of the decoded address lines.

According to a further embodiment, a method for restoring a global bit line is provided. The method for restoring of a global bit line in an SRAM circuitry having SRAM cells for storing data words of a length of at least one bit, wherein each bit of the data words is stored in an assigned SRAM cell, may comprise decoding address signals on address lines for addressing the data words, coupling a local bit line to the SRAM cells of different data words with different addresses, restoring a global bit line, wherein the restoring is triggered based on a trigger signal derived from a portion of the decoded address lines.

BRIEF DESCRIPTION OF THE SEVERAL VIEWS OF THE DRAWINGS

Embodiments of the invention will now be described, by way of example only, and with reference to the following drawings.

DETAILED DESCRIPTION

Figure 1:
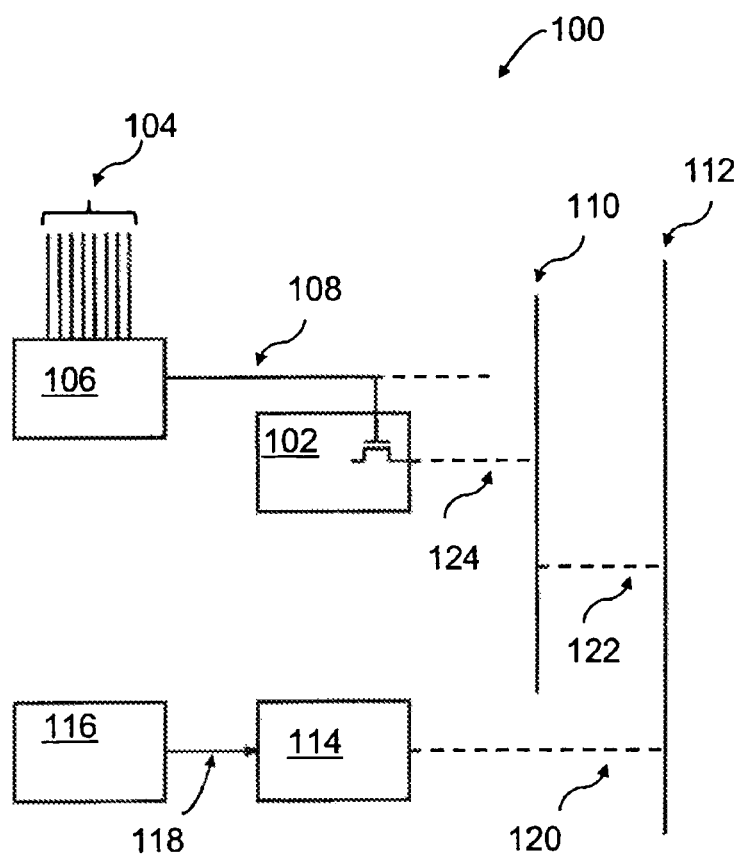
FIG. 1 shows a block diagram of an SRAM circuitry according to the state of the art.

In the following, a detailed description of the drawings will be given. All illustrations in the drawings are schematic.

Firstly, a block diagram of an SRAM circuitry according to the state of the art will be described. Afterwards, embodiments of an SRAM circuitry with the inventive features as well as a method for restoring of a global bit line in an SRAM circuitry will be described.

FIG. 1 shows a block diagram of an SRAM circuitry 100 according to the state of the art. Address lines 104 are decoded by a decoding unit 106 in order to address SRAM cells 102. One or more SRAM cells may be addressed. Typically, several SRAM cells belonging to one data word and representing one bit, each of the data word may be addressed by one word line (WL) 108. If, for example, n address lines carrying coded address line signals may be connected to an input port of the address decoding unit, $2^n$ different data words may be addressed. The dashed line that is shown in an elongation of WL 108 may symbolize a connection to more SRAM cells. An output port of the SRAM cell 102 may be coupled, 124, to a local bit line (LBL) 110. The local bit line (LBL) may connect the output of SRAM cells with identical positions within a data word, but with different addresses. An activation of an output of an SRAM cell may be achieved by a FET as shown in box 102. A coupling between the SRAM cell and the local bit line may be achieved by a direct galvanic contact between a source/drain of the FET as part of the SRAM cell and the LBL 110. The FET in box 102 may be part of a six transistor design of the SRAM cell 102. The transistor may be the activation transistor of the SRAM cell.

Figure 3:
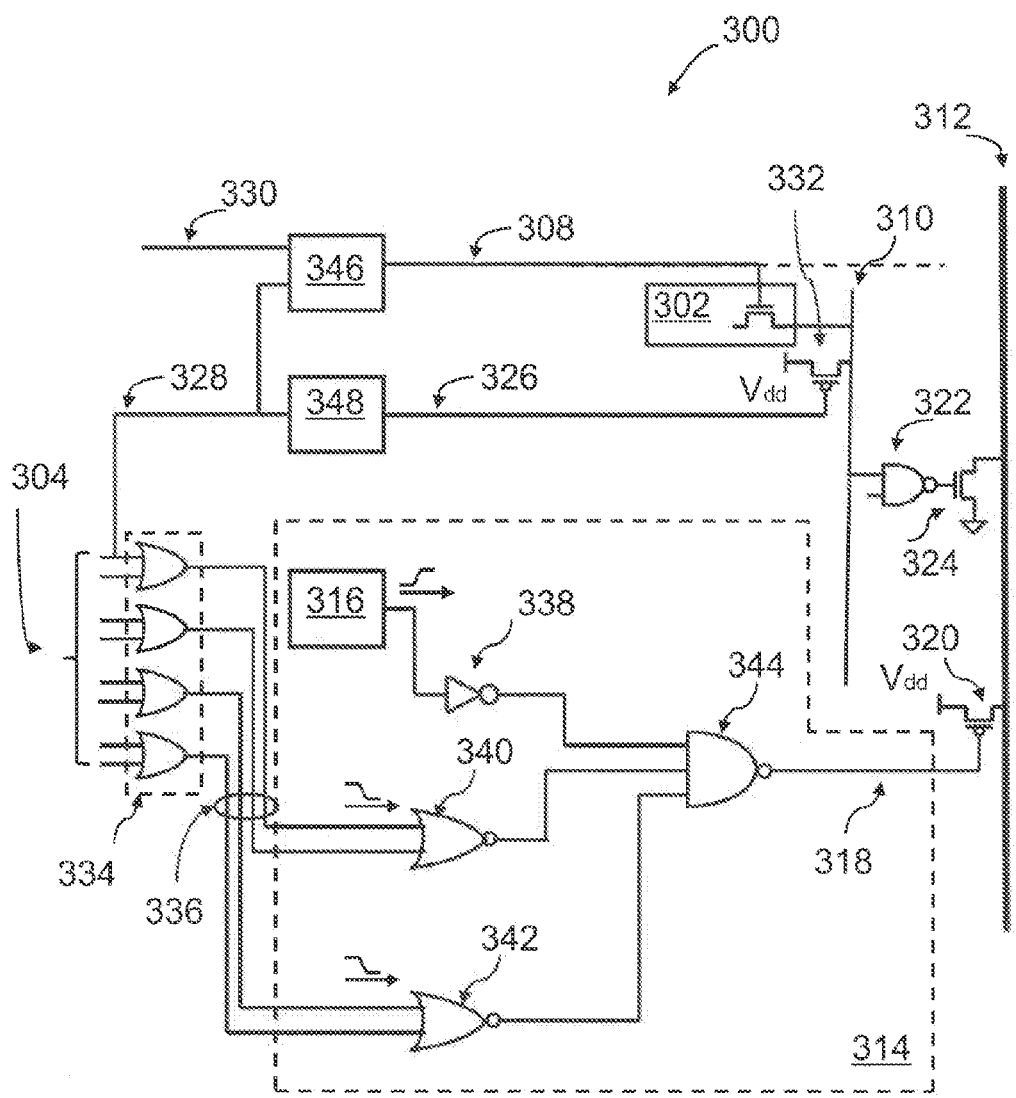
FIG. 3 shows a more detailed block diagram of an inventive embodiment of an SRAM circuitry, in accordance with one or more aspects of the present invention.

Additionally, a global bit line (GBL) 112 is shown in FIG. 1. A coupling between the LBL 110 and the GBL 112 is shown as dashed line 122. Such a coupling 122 may, e.g., be achieved by a NAND-gate followed by an N-FET, as shown in FIG. 3. In FIG. 1, also shown is a timing control for a GBL restore unit 114. The GBL restore unit 114 is symbolically coupled via dashed line 120 to the GBL. The coupling may be achieved by a P-FET as shown in FIG. 3.

Additionally, FIG. 1 shows a connection 118 between a global bit line restore unit 114 and a clock circuit 116 that might trigger a global bit line restore signal.

Figure 2:
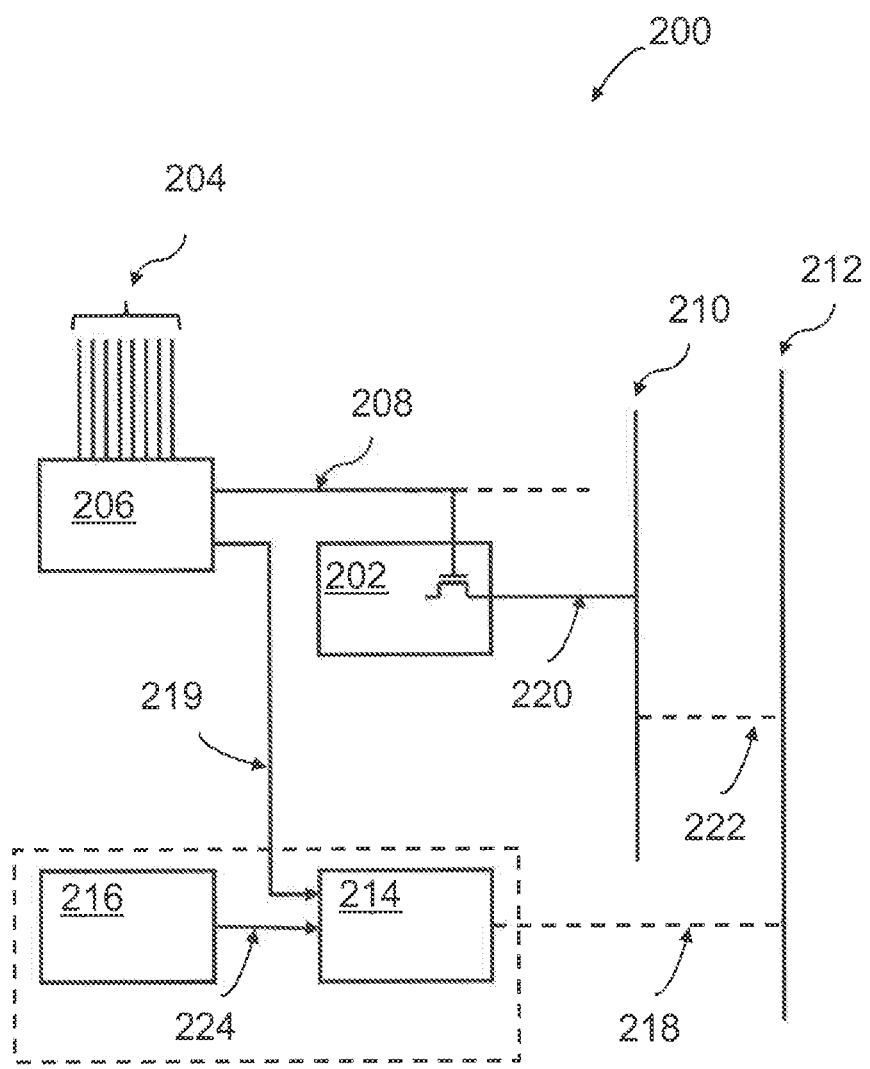
FIG. 2 shows a block diagram of an inventive embodiment of an SRAM circuitry, in accordance with one or more aspects of the present invention.

FIG. 2 shows a block diagram of an inventive embodiment of an SRAM circuitry 200. Again, address lines 204 may represent address lines carrying coded address line signals. There may be, for example, eight coded address lines. They may be grouped into two groups. For example, five coded address lines representing a group of low significant address lines, and a group of the three remaining coded address lines named most significant coded address lines. Finally, each activated combination of the n coded address lines may lead by decoding to $2^n$ physical WLs 208, which may each address one data word comprising one or more SRAM cells, depending on the data word length counted in bits. Any other split of coded address lines is possible, e.g., four coded address lines representing a group of low significant address lines. In this case, there may be 16 cells per local bit line.

The FET shown as part of the SRAM cell 202 may establish a contact between the SRAM cell with its stored value ("0" or "1") and the local bit line 210. Again, a coupling of the LBL to the GBL 212 is shown, as dashed line 222. Additionally, a GBL restore unit 214 is shown which is coupled to the GBL 212 symbolized by dashed line 218. However, the activation of the GBL restore unit may be done differently compared to the embodiment shown in FIG. 1. A line 219 between the decoding unit 206 and the GBL restore unit may symbolize that the GBL restore unit may be triggered by a trigger signal, generated or derived from address lines 204, via the decoding unit 206. In particular, a start of a GBL restore signal charging the GBL may be triggered by a signal on the line 219.

An end of a GBL restore signal induced onto the GBL 212 may be triggered by a clock signal unit 216. An adequate clock signal may be derived from the system clock of an SRAM circuitry. A connection between the clock signal unit 216 and the GBL restore unit 214 may be symbolized by line 224. Alternatively, clock signal unit 216 may also be part of GBL restore unit 214.

FIG. 3 shows a more detailed block diagram of an embodiment of the inventive SRAM circuitry 300. WL 308, SRAM cell 302, LBL 310, GBL 312 may be equivalent to symbols and functions in the embodiment shown in FIG. 2. However, other elements are shown in more detail.

The coded address lines may again be split into an upper group of 3 coded address lines and a lower group of coded address lines (not shown). Three coded address lines may be decoded into eight physical decoded address lines 304 for address line signals. One of the decoded address lines is shown as physical address line 330, which may be one of a lower group of address signals. Via connection 328, one of the decoded address lines 304 and one decoded address line 330 may be fed into word decode circuit 346. In its simplest form, the word decode circuit 346 may be an AND-gate. This way, for each one of a combination of n coded address lines, exactly one WL 308 may be activated. Thus, if n coded address lines may be available and if n=8, then 256 WLs may be activated, which in turn may allow an addressing of 256 individual data words. However, any other number of n coded address lines may be possible.

Block 348 represents a LBL restore unit 348. This restore unit is also triggered via one of the decoded address lines 304 of the upper or MSB group of coded address lines. The LBL restore unit may comprise two logic inverters in series and may be connected to P-FET 332, which may be connected to $V_{dd}$ with its drain connector. The source connector of P-FET 332 may be connected to the LBL 310. Thus, a restore with charge carrier may be achieved during periods of not activated WLs 308. The LBL restore unit may be coupled to P-FET 332 via line 326.

In a similar fashion, P-FET 320 may be connected between $V_{dd}$ and the GBL 312. During phases of a non-activation of a WL 308 the GBL may be recharged with charge carriers. A connection between the LBL 310 and the GBL 312 may be achieved by a NAND-gate 322 connected with one input port to the LBL 310. An output port of the NAND-gate 322 may be connected to a gate of an N-FET 324. One of the source or drain port of P-FET may be connected to ground symbolized by a triangle pointing downwards. This way, whenever WL 308 is activated, the content ("0" or "1") stored in the SRAM cell 302 may be made available on the LBL 310 and simultaneously on the GBL 312.

Block 314 may symbolize the GBL restore unit. It may contain a NAND-gate 344, two NOR-gates 340, 342, an inverter 338 and a clock signals unit 316. These electronic components or logic gates are connected as shown in FIG. 3. Basically, output lines from the four OR-gates 334 are connected, via lines 336, to the NOR-gates 340 and 342 with two input ports each. The output ports of the NOR-gates 340, 342 may then be fed to input ports of a NAND-gate 344. A third input port may be connected via inverter 338 to the output port of a clock signal unit 316. An output port of NAND-gate 344 may be connected to the gate of P-FET 320. The line 318 may also include a driver circuit, which may have the form of two inverters in series. The NAND-gate 344 may also be an AND-gate if the inputs may be inverted.

The four OR-gates 334 "ORing" eight decoded address lines 304 may be physically at a different place of a SRAM chip than the GBL restore unit 314. The "ORing" of signals of lines 304 may reduce the number of physical lines connecting the output ports of OR-gates 334 and the input ports of NOR-gates 340 and 342. Thus, the OR-gates 334 may be called distributed OR-gates.

However, the components/logic gates may represent a higher level abstraction than physical components like transistors, diodes and other components. A skilled person in the art knows how to translate the logic diagram in a diagram comprising electronic components as just mentioned. The components may be realized using CMOS technology.

The components in the GBL restore unit 314 may be connected in such a way—as a skilled person may understand from the connections and symbols as shown—that a falling edge of one of the address lines of most significant decoded address lines 304 may lead to a GBL restore via GBL restore unit 314 and P-FET 320. In turn, a rising edge of a signal from the clock signal unit 316 may be stopped via inverter 338 and NAND-gate 344, a restore with charge carriers via P-FET 320. It may also be noted that the signals on the most significant bits of address lines have to stay low until the signals of the clock signal unit rises.

Such a circuitry may enable a start of a GBL restore at a very early instant after an end of an active signal on any of the address lines 304, which may be equivalent to actively addressing a word in SRAM cells 302 via WL 308.

An end of a GBL restore cycle may be initiated by a rising edge of the clock signal unit 316. This way, a very direct linkage between address lines and the start of a GBL restore may be enabled.

Figure 4:
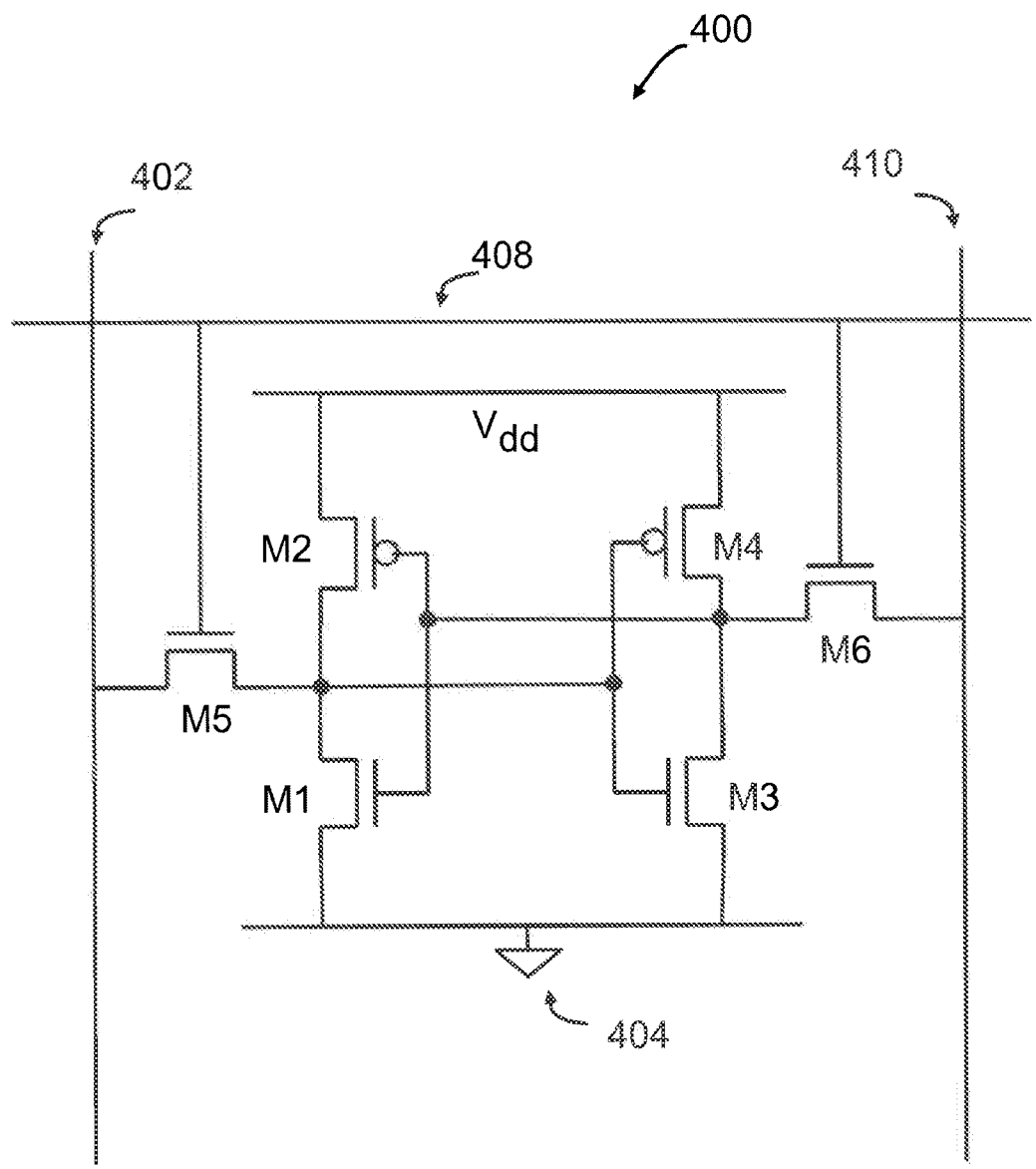
FIG. 4 shows a 6-transistor memory cell, in accordance with one or more aspects of the present invention.

FIG. 4 shows a 6-transistor memory cell 400. Each bit of a data word stored in an SRAM cell may be stored on four transistors M1, M2, M3, M4 that form two cross-coupled inverters. Such a storage cell may have two stable states, which may be used to denote "0" and "1". Two of the transistors (M1, M3) are also coupled to ground 404, while the other two transistors (M2, M4) are coupled to $V_{dd}$. Two additional access transistors M5, M6 may serve to control the access to a storage cell during read and write operations. A typical SRAM may use six MOSFETs to store each memory bit. In addition to such 6T SRAM, other kinds of SRAM chips may use eight or ten transistors, or more transistors per bit. This may sometimes be used to implement more than one (read and/or write) port, which may be useful in certain types of video memory and register files implemented with multi ported SRAM circuitry. A word line 408 may activate the transistors M5 and M6 simultaneously. This may enable a connection from the cross coupled inverters of the cell to the word line 410 and a complementary word line 402. The word line and the complementary word line may have always complementary statuses "0" and "1". Thus, it may be easier to detect a voltage difference when reading out a cell. However, it may not be required to read a cell in such a manner. A read out may be achieved only by activating, e.g., transistor M6 through a signal on the word line 408.

Figure 5:
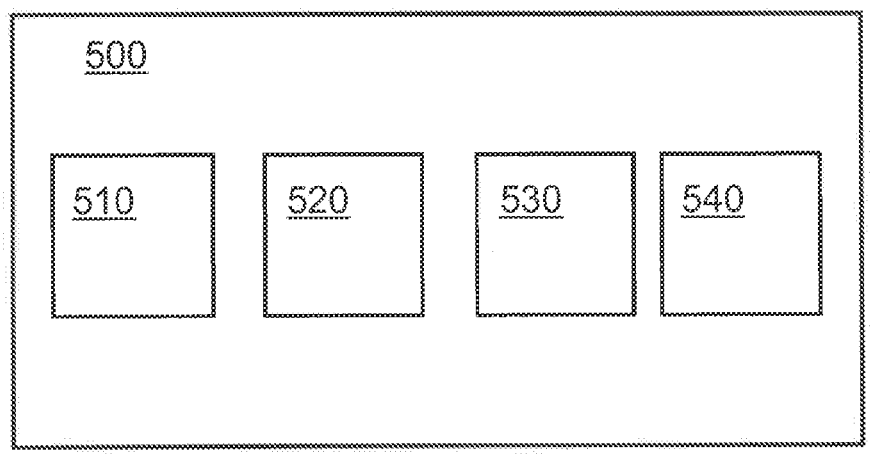
FIG. 5 shows a block diagram of a method for restoring of a global bit line in an SRAM circuitry, in accordance with one or more aspects of the present invention.

FIG. 5 shows a block diagram of a method for restoring of a global bit line in an SRAM circuitry. Method 500 for restoring of a global bit line in an SRAM circuitry having SRAM cells for storing data words of a length of at least one bit, wherein each bit of the data words may be stored in an assigned SRAM cell, the method may comprise decoding, 510, address signals on address lines for addressing the data words, coupling, 520, a local bit line to the SRAM cells of different data words with different addresses, and restoring, 530, a global bit line, wherein the restoring is triggered based on a trigger signal derived from a portion of the decoded address lines.

In one embodiment, the method may also comprise ending, 540, a GBL restore. Such an end may be triggered by a signal from a clock signals unit.

In the above mentioned embodiments, an ending of a global bit line restore may in particular be triggered by a rising edge clock signal circuit.

In the context of this application, the following expression conventions have been followed:

An SRAM cell—An SRAM cell may denote a static random memory cell comprising six transistors. Each bit in an SRAM may be stored on four transistors that may form two cross-coupled inverters. This storage cell may have two stable statuses which may be denoted "0" and "1". Two additional access transistors may serve to control the access to the storage cell during read and/or write operations. A typical SRAM may use six MOSFETs. In addition to such six transistor SRAM cells, other kinds of SRAM chips may be used like eight or ten transistor SRAM cells, or even more transistors per bit. These may be used to implement more than one (read and/or write) port, which may be useful in certain types of video memory and register files implemented with multi-port SRAM circuitry.

Decoding unit—A decoding unit or address decoding unit may denote a circuitry that may decode coded address line signals on address lines into single electrical lines such that each coded address may correspond exactly to one decoded address or word line. This way $2^n$ words may be addressed with n coded lines. The decoding unit may also provide partly decoded intermediate lines as output.

Local bit line—A local bit line (LBL) may denote an electrically conducting line, connecting memory cells of different data words belonging to a same block of data words. The length of local bit lines may be limited in physical length due to signal travel times due to RC effects on the local bit line. Generally, a local bit line may be seen as a read or write line for a bit in a data word.

Global bit line—A global bit line (GBL) may denote an electrically conducting line, combining signals of several local bit lines. A coupling of a local bit line to a global bit line may be achieved by electronic gates and/or transistors. In one case, the coupling may be achieved by a NAND gate followed by a N-FET. A N-FET may denote a metal-oxide-semiconductor field-effect transistor with a n-type channel. The local bit line may be connected electrically to an input port of a NAND gate. The output port of the NAND gate may be coupled to the gate of a N-FET.

Coupling—The term coupling may denote several types of connections. A simple coupling may be achieved by a direct electrical connection between two elements to be coupled. A more complex coupling may involve other electric or electronic components, such as resistors, capacitors, diodes, transistors, logic gates or a combination of such elements. These components may be electrically connected to each other and the two elements to be coupled.

Restore—A restore may denote a charging of a line with charge carriers. For example, a plate of a capacitor may be charged with charge carriers and may be recharged after a discharge of the plate. In the same sense, an electrical line, e.g., a bit line may be charged. After a discharge of the bit line, e.g., a local bit line or a global bit line, the bit line may be recharged again. Such a recharge may also be named restore in the sense that charge carriers are restored on the bit line. Such a restore is a common technique in high speed SRAM designs. The restore may also be applied if the local or global bit line may have not been discharged. Generally, there are two dual methods known: N-domino and P-domino. N-domino is predominate, since N-FETs are stronger compared to P-FETs. Currently, there is a trend recognizable that the strength of P-FETs and N-FETs become comparable. With N-domino a node may be pre-charged "to 1" via a P-FET and may be discharged by an N-FET. With P-domino a local node may be pre-charged "to 0" by an N-FET and may be discharged by a P-FET.

Restore unit—A restore unit may denote a network of electronic components required to achieve a time controlled restore of a bit line. In case of a local bit line, it may be a local bit line restore unit. In case of a global bit line, it may be a global bit line restore unit.

Clock—A clock or clock signal may denote a regular clock signal. It is typically derived from a system clock which may control central functions and timings of signals on an electronic chip or electronic circuitry or a network of electronic chips containing electronic components such as logical or logic gates.

ORing—The term "ORing" may denote the fact that two electrical lines may be fed to a logic OR-gate and be combined in such a logic gate. An output port of the OR-gate may behave like a logic OR-function, depending on the input signals of the two lines. An equivalent short form wording may be used for other logic functions performing other logic operations.

The above-described SRAM circuitry for storing at least one data word of at least one bit length may provide a couple of advantages.

The disclosed topology may address selected cell and address timing inaccuracies in high speed SRAM circuitry in order to deliver a reliable design for even higher operating frequencies. The architecture may guarantee a reliable function at even the highest operating frequencies. This is due to a reliable timing of a global bit line recharge based on read or select signals for a specific global bit line. The global bit line may be coupled via a local bit line to an SRAM cell. A beginning or start of a refresh of the global bit line may be controlled by decoded address line signals addressing the specific SRAM cell. Thus, timing inaccuracies and run time delays in clock controlled global bit line restore units may be reduced or avoided. In the end, a global bit line restore may start earlier resulting in more charge carriers on the global bit line, making a read out of SRAM cells more reliable at very high frequencies or short cycle time in the range of 200 ps.

Since also a local bit line restore signal is derived from decoded address lines—in particular a group of decoded address lines—a relationship between a local and a global bit line restore may be independent of timing bit variations for a word clock signal, since the local and a global bit line restore signal may be derived from the same common signal: a group of decoded address lines.

Further, it may not be required to include specific fail save circuitries in order to avoid short cuts potentially generated by a joint availability of a global restore signal and a coupling of a local bit line to a global bit line. Additionally, time margins that have been designed into the architecture of SRAM cells may be reduced in order to better restore a global bit line for more reliable voltage detection/read operation on the global bit line.

In one embodiment of the SRAM circuitry, the decoding unit may be adapted for decoding n address lines into $2^n$ individual word lines.

In a further embodiment of the SRAM circuitry, the decoding unit may be adapted for treating one portion of the address lines differently than the remaining address lines. That way, higher level address lines in a $2^n$ schema may be treated as most significant address lines. For example, if eight coded address lines are present and a series of SRAM cells block may be available, eight words in an SRAM circuitry may be assigned to one local bit line. In order to address these eight words, the eight decoded address lines may be split into an upper part and a lower part. The upper part may be named most significant address line bits by referring to most significant bit (MSB) lines of the address lines. From these MSB lines of individual addresses, a restore signal for a global bit line may be generated.

In another embodiment of the SRAM circuitry, the one portion of the address lines may be decoded such that decoded address lines may comprise a decoded address line carrying one of the most significant decoded address bits. In the context of the above, just one address line may be used as a trigger signal for a start of a global bit line restore.

In again another embodiment of the SRAM circuitry, the one portion of the address lines may be decoded such that decoded address lines may comprise decoded address lines carrying two of the most significant decoded address bits. The at least two decoded address lines may be coupled by a logic gate. In particular, the coupling may be achieved by a logic OR-gate. Also, more than just two decoded address lines may be coupled or combined. This may be done by more than one logic OR-gate. In particular, every two of the decoded address lines may be "ORed". This enables a reduction of physical lines that may be connected to other components. In particular, these OR-gates may be called "distributed OR-gates" or "distributed ORs" denoting that the OR gates are placed at other places compared to the place where the signals are required. An "ORing" of the signals may reduce the number of physical connection thereby saving space on a chip or circuitry and enabling a maximization of a common path on the chip. In a sense but not in a 1-to-1 fashion, the "ORing" of decoded address lines reverses the process of decoding.

In another embodiment of the SRAM circuitry, an output of the logic gate, e.g. the OR-gate, may represent the trigger signal for triggering the global bit line restore unit for precharging the global bit line. In the context of the above paragraph, the other elements may be electronic components of a global bit line restore unit. This way, an active signal of an address line finally being converted into a word line, may be used to generate a start of a global bit line restore signal. Thus, a clear timing control for the start of a global bit line restore may be defined. A derived clock signal may no longer be required.

In a further embodiment of the SRAM circuitry, the global bit line restore unit may comprise at least one logic gate connected in such a way that a trailing edge of any of the at least one decoded address bits may start the pre-charging of the global bit line by the global restore unit.

In particular, at least one NOR-gate and at least one inverter may be used in order to trigger a global bit line restore based on a trailing edge of one of the decoded address lines. The trailing edge may be a falling edge of one of the decoded address lines. This may assume that a word line may be activated by a leading edge of one of the decoded address lines. And it may be deactivated by a trailing edge. Actually, it may be reverse in case of the local bit line. A leading edge may deactivate a local bit line restore and a trailing edge may activate a local bit line restore.

In case of the global bit line, an additional NAND-gate may be provided. This way, a precise timing impulse is given for a start of the global bit line restore. If the decoded address line signals—and more specifically, the most significant bit or bits of decoded address lines signals—have a falling edge, the addressed SRAM cells may no longer be active and may no longer provide their signals to a local bit line, and thus to a global bit line. Consequently, this may be a good instance to start the global bit line restore. This may enable a maximum number of charge carriers on the global bit line before a next read signal may activate corresponding SRAM cells.

In another embodiment of the SRAM circuitry, at least one of the SRAM cells may be a six-transistor-SRAM cell. Other SRAM cells may be possible, e.g., an eight or ten transistor cell, with additional read ports. Basically all other multiport RAM cells may be used.

In again another embodiment of the SRAM circuitry, an output of the SRAM cells may be coupled to the local bit line, enabling an easy read operation on the local bit line. In particular, the coupling may be achieved by an N-FET, which may be called activation transistor of the SRAM cell, and which may be part of the SRAM cell. The word line may be coupled to the gate of such an activation N-FET.

In yet another embodiment of the SRAM circuitry, the coupling of the local bit line to the global bit line may be a combination of a logic gate followed by a transistor. Such a combination may be a logic NAND-gate connected in such a way that an output of the NAND-gate may be connected to the gate of an N-FET. In such a circuitry, a source of an N-FET may be connected to ground while a drain contact of the N-FET is connected to a global bit line. The N-FET may be of symmetrical design or another type of transistor.

In another embodiment of the SRAM circuitry, the global bit line restore unit may be coupled via a transistor to the global bit line. In particular, the transistor may be a P-FET. The gate of the P-FET may be coupled to an output of the global bit line restore unit. A drain contact of the P-FET may be connected to $V_{dd}$ and a source contact of the P-FET may be connected to the global bit line. However, the P-FET may be of symmetrical design or another type of transistor.

In yet another embodiment of the SRAM circuitry, an end of the global bit line restore is triggered by a signal generated by a clock signal unit. As the end of a global bit line restore signal may be less time critical if compared to the beginning or the start of a global bit line restore, a clock signal may be sufficient to signal the end of a global bit line restore signal. This architecture helps to save space on an SRAM chip because a clock may be available anyway.

In another advanced embodiment of the SRAM circuitry, the end of the global bit line restore may be triggered by a clock signal that is coupled to the at least one logic gate such that the global bit line restore may be stopped on a leading edge of the clock signal. The leading edge may be a raising edge of the clock signal.

In another embodiment of the method for restoring of a global bit line in an SRAM circuitry, the method may comprise additionally combining by at least one logic gate most significant bits of decoded address lines forming a signal for the starting of the global bit line restore.

It should also be noted that embodiments of the invention have been described with reference to different subject-matters. In particular, some embodiments have been described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular between features of the method type claims, and features of the apparatus type claims, is considered as to be disclosed within this document.

The aspects defined above and further aspects of the present invention are apparent from the examples of embodiment to be described hereinafter and are explained with reference to the examples of embodiment, but to which the invention is not limited.

While the invention has been described with respect to a limited number of embodiments, those skilled in the art, benefitting from this disclosure, will appreciate that other embodiments may be devised, which do not depart from the scope of the invention as disclosed herein. Accordingly, the scope of the invention should be limited only by the attached claims.

It should also be noted that the term "comprising" does not exclude other elements or steps and "a" or "an" does not exclude a plurality. Also, elements described in association with different embodiments may be combined. It should also be noted that reference signs in the claims should not be construed as limiting elements.

What is claimed is:

1. A static random-access memory (SRAM) circuitry having SRAM cells for storing data words of a length of at least one bit, wherein each bit of the data words is stored in an assigned SRAM cell, the SRAM circuitry comprising:
    address lines for addressing data words by address signals;
    a decoding unit for decoding the address signals on the address lines to generate word line signals on a word-line per addressed data word, wherein at least a portion of the address lines is decoded by the decoding unit to provide at least one decoded address line carrying at least one decoded address bit;
    a local bit line to be coupled to the SRAM cells of different data words with different addresses;
    a global bit line to be coupled to the local bit line; and
    a global bit line restore unit electronically coupled to the global bit line and the decoding unit for pre-charging the global bit line upon being triggered by a trigger signal based on a trailing edge of the at least one decoded address bit from the decoding unit.

2. The SRAM circuitry of claim 1, wherein the decoding unit is adapted for decoding n address lines into 2" individual word lines.

3. The SRAM circuitry of claim 1, wherein the decoding unit is adapted for treating one portion of the address lines differently than the remaining address lines.

4. The SRAM circuitry of claim 3, wherein the at least one decoded address bit is one of most significant decoded address bits.

5. The SRAM circuitry of claim 3, wherein the decoded address lines comprise at least two address lines carrying two of most significant decoded address bits, and wherein the at least two most significant address bits are coupled by a logic gate.

6. The SRAM circuitry of claim 5, wherein an output of the logic gate comprises the of the at least one decoded address bit from the decoding unit.

7. The SRAM circuitry of claim 4, wherein the global bit line restore unit comprises at least one logic gate.

8. The SRAM circuitry of claim 1, wherein at least one of the SRAM cells is a six-transistor-SRAM cell.

9. The SRAM circuitry of claim 1, wherein an output of the SRAM cells is coupled to the local bit line.

10. The SRAM circuitry of claim 1, comprising a logic gate followed by a transistor for coupling the local bit line to the global bit line.

11. The SRAM circuitry of claim 1, further comprising a transistor, wherein the global bit line restore unit is coupled via the transistor to the global bit line.

12. The SRAM circuitry of claim 1, wherein an end of a global bit line restore signal, being generated by the global bit line restore unit, is triggered by a signal generated by a clock signal unit.

13. The SRAM circuitry of claim 12, wherein the signal generated by the clock signal unit is coupled to the at least one logic gate such that the global bit line restore is stopped on a leading edge of the signal generated by the clock signal unit.

14. A method for restoring a global bit line in a static random-access memory (SRAM) circuitry having SRAM cells for storing data words of a length of at least one bit, wherein each bit of the data words is stored in an assigned SRAM cell, the method comprising:
    decoding address signals on address lines for addressing the data words, wherein al least a portion of the address lines is decoded to provide at least one decoded address line carrying at least one decoded address bit;
    coupling a local bit line to the SRAM cells of different data words with different addresses; and
    restoring the global bit line, wherein the restoring is triggered based on a trigger signal derived from a trailing edge of the at least one decoded address bit.

15. The method of claim 14, wherein the trailing edge of the at least one decoded address bit is the result of combining, by at least one logic gate, most significant bits of decoded address lines.

* * * * *